(12) United States Patent
Yamamura

(10) Patent No.: US 6,583,810 B1
(45) Date of Patent: Jun. 24, 2003

(54) METHOD AND APPARATUS FOR MEASURING A DIAMETER OF A SINGLE CRYSTAL

(75) Inventor: Haruo Yamamura, Kishima-gun (JP)

(73) Assignee: Sumitomo Sitix Corporation, Amagasaki (JP)

( * ) Notice: Subject to any disclaimer, the term of this patent is extended or adjusted under 35 U.S.C. 154(b) by 0 days.

(21) Appl. No.: 09/076,007

(22) Filed: May 12, 1998

(51) Int. Cl.⁷ .................................. H04N 7/18
(52) U.S. Cl. ........................... 348/61; 117/14
(58) Field of Search ............... 348/61, 86; 117/14; H04N 7/18

(56) References Cited

FOREIGN PATENT DOCUMENTS

| | | |
|---|---|---|
| JP | 62-87482 | 4/1987 |
| JP | 62-138387 | 6/1987 |
| JP | 4-86509 | 3/1992 |

*Primary Examiner*—Young Lee
(74) *Attorney, Agent, or Firm*—Armstrong, Westerman & Hattori, LLP

(57) ABSTRACT

The invention relates to method and apparatus for measuring a diameter of a single crystal wherein growth portions including a shoulder portion and the following can be accurately measured with respect to their diameter. The method for the measurement includes the steps of causing an oscillation center of a single crystal being grown according to the Czochralski method while oscillating and a scanning line of a one-dimensional CCD camera to coincide with each other, and deciding a diameter of the single crystal from all the images measured with the one-dimensional CCD camera over a measuring time which is longer than an oscillation cycle of the single crystal. The apparatus includes a one-dimensional CCD camera, an XY table capable of moving the one-dimensional CCD camera in horizontal and vertical directions, an apparatus for deciding a scanning position, at which an image of a growth portion of a single crystal is measured, from image signals from the one-dimensional CCD camera, and an apparatus for calculating a diameter of the single crystal based on the image signals from the one-dimensional CCD camera scanning at the scanning position. According to the method and apparatus the invention for measuring a diameter of a single crystal, a diameter of the single crystal being grown can be precisely measured, thereby ensuring an appropriate control of the diameter of the single crystal automatically without resorting to hands (or without resorting to manual operations). Moreover, a demand for single crystals with a large size and a heavy weight can be met, and the growth of a single crystal can be made efficiently.

6 Claims, 7 Drawing Sheets

METHOD AND APPARATUS FOR MEASURING A DIAMETER OF A SINGLE CRYSTAL

FIELD OF THE INVENTION

This invention relates to method and apparatus for measuring a diameter of a single crystal being grown according to the Czochralski method, and more particularly, to method and apparatus for measuring a diameter of a single crystal, which enable one to accurately measure the diameter of a portion being grown in case where the single crystal, which is pulled up for its growth, is oscillated.

DESCRIPTION OF THE RELATED ART

Many methods of preparing a single crystal are known, among which the Czochralski method has been widely applied to as a technique capable of industrial mass production with respect to the growth of a silicon single crystal.

FIG. 12 is a view showing an arrangement of silicon growing apparatus using the Czochralski method. The single crystal is grown in a container in a chamber 7 wherein a crucible 1 is place at the central portion thereof. A heater 2 is provided to surround the crucible 7 therewith, and a melt of a crystalline starting material, i.e., melt 3 of polysilicon, heated by means of the heater is accommodated in the crucible 1. A seed crystal 5 attached at the tip of a wire 4 is brought into contact with the surface of the melt 3 at the lower end thereof. This seed crystal 5 is pulled upwardly, whereupon a single crystal 6 grows at the lower end of the seed crystal as a result of the solidification of the melt. The thus grown single crystal 6 consists of a necking portion 6a, in which its diameter is reduced in order to exclude dislocation from the crystal surface, a shoulder portion 6b, in which its diameter gradually increases from the necking portion 6a, and a body portion 6c utilized as a wafer after growth.

In recent years, there is a great demand for a large diameter of a pulled single crystal, with the result that a single crystal being grown becomes great in weight. To this end, it becomes necessary to reduce the diameter of the single crystal at the necking portion thereof to an extent necessary for making a dislocation-free crystal. Moreover, the diameter should be one that is larger than a given dimension sufficient to tolerate the heavy weight of the single crystal. Accordingly, for the growth of a silicon single crystal, it is important to accurately measure and appropriately control the diameter of a single crystal at its necking portion.

From this point of view, there have been made proposals on the measurement of the diameter of a single crystal using (a) a one-dimensional CCD camera and (b) a two-dimensional CCD camera.

FIGS. 2 to 4 attached herewith are, respectively, views illustrating the manner of measuring the diameter according to conventional CCD cameras. More particularly, FIG. 2 shows the relation between the scanning line of a one-dimensional CCD camera and the single crystal growth portion, and FIG. 3 is a view illustrating how to determine the diameter of the single crystal growth portion from a luminance distribution image produced around the single crystal on the scanning line. FIG. 4 shows the relation between a plurality of scanning lines and the single crystal growth portion in case where a two-dimensional CCD camera is used.

(a) In order to measure the diameter of a single crystal by use of CCD cameras, usual practice is to observe a luminance distribution caused by the fusion ring of the single crystal growth portion via a window provided at the upper portion of a chamber by means of a CCD camera, which is provided at the outside of the chamber of a growing device. Where a one-dimensional CCD camera is used for the measurement, the scanning line G, shown in FIG. 2, should be so set as to go across the center of the diameter of a single crystal. The luminance distribution is measured under such conditions as mentioned above, and the diameter of the single crystal growth portion can be exactly obtained from the distance, $d_b$, between the luminance peaks of the fusion ring in the proximity of the single crystal growth portion. In general, where the scanning line crosses the center of the diameter of the single crystal, the distance, $d_b$, between the luminance peaks is measured to be slightly larger than the actual diameter of the single crystal.

At that time, the diameter at the necking portion of the single crystal is fine, and the single crystal being pulled by means of a wire is swung or oscillated during the course of the growth, so that it is difficult to scan the single crystal across the center of the diameter thereof by use of a one-dimensional CCD camera. To avoid this, there has been proposed a device for measuring a diameter which includes means for reciprocating a scanning line more quickly than a swinging or oscillating speed of a single crystal, and a detecting unit for selecting an image, wherein the scanning line is in coincident with the center of the diameter, from two-dimensional images obtained by reciprocating movement of the scanning lines and outputting a value of the diameter of the single crystal (see Japanese Laid-open Patent Application No. 62-138387).

This diameter-measuring device is not practically suited as a growing device because a mechanism of reciprocating the scanning line at high speed becomes complicated, and stable measurement over a long time is difficult to continue. Where a single crystal with a diameter of 8 inches (200 mm) at a body portion thereof is grown, for example, the diameter at the necking portion of the single crystal becomes as fine as around 5 mm. In addition, the oscillation of the single crystal may reach 2 to 3 mm in radius. In this case, the proposed device is not reliable because accuracy (with an error of 10% or below) required for general purposes cannot be obtained.

The required accuracy (with an error at 10%) is decided from the diameter of a necking portion necessary for dislocation-free crystallization (6 mm or below), the diameter, which is tolerable with the weight of a single crystal, (4 mm or over when the weight is at 150 kg), and the accuracy (±20%), which is ensured by the control of the diameter of a single crystal.

(b) On the other hand, where the diameter of a single crystal is measured by use of a two-dimensional CCD camera, a single crystal growth portion is instantaneously scanned with a number of scanning lines G as shown in FIG. 4, thereby obtaining two-dimensional image information. In this case, if the single crystal is being swung or oscillated, the number of scanning lines contain a scanning line which goes across the center of the diameter of the single crystal. The diameters of the respective single crystal growth portions can be determined from the image signals of measured luminance distribution, among which the greatest value of the diameter is taken as a diameter of the growth portion. In this way, the diameter of the single crystal can be measured relatively accurately. Accordingly, there has been proposed a device of measuring a diameter using a two-dimensional CCD camera (see Japanese Laid-open Patent Application Nos. 62-87482 and 04-86509).

However, the resolving ability of the image with the two-dimensional CCD camera is much lower than that made by a one-dimensional CCD camera. Accordingly, when using the above type of measuring device for the measurement of a diameter at the necking portion, a high image accuracy cannot be expected, so that the diameter is measured while enlarging the image by use of a zooming device. On the other hand, as the diameter increases in the course of the growth of the shoulder and the following of the single crystal, a wide-range measuring field of view becomes necessary. This is beyond the measurement with a two-dimensional CCD camera, and it is necessary to continue measurement while switching over to a one-dimensional CCD camera. This means that the proposed diameter-measuring device includes, in combination, a measurement with a two-dimensional CCD camera using a zooming device and a measurement with a one-dimensional CCD camera. Thus, there arises the problem that the arrangement of the measuring device becomes complicated and large in scale, thus being not suited for practical applications.

OBJECT OF THE INVENTION

Since there is a demand not only for a large diameter and a heavy weight of a pulling single crystal, but also for a high growth efficiency of the single crystal, the control of the diameter of the single crystal has to be performed automatically without resorting to hands (not manually). In order to meet the demand, it is premised on the assumption that the diameter is accurately measured over the overall length of a single crystal including a necking portion thereof.

Accordingly, it is an object of the invention to provide method and apparatus for measuring a diameter of a single crystal which can overcome the problems of the prior art techniques and wherein a one-dimensional CCD camera is used whereby one is enabled to accurately measure the diameter of not only a necking portion, but also growth portions including a shoulder portion and the following in the course of the growth of a single crystal.

SUMMARY OF THE INVENTION

In the growth of a single crystal according to the Czochralski method, it is difficult to avoid oscillation involved in the single crystal pulled by means of a wire. Hence, we drew attention to the fact that the oscillation has a given cycle on the assumption that a single crystal being grown is oscillated or swung, thus arriving at the completion of the invention. The subject matter of the invention resides in a method for measuring a diameter of a single crystal described under (1) below and also in an apparatus for measuring a diameter of a single crystal described under (2), as is particularly described with reference to FIG. 1 hereinafter.

(1) A method for measuring a diameter of a single crystal comprises the steps of causing the center of oscillation of a single crystal, which is grown according to the Czochralski method while oscillating, and a scanning line of a one-dimensional CCD camera to coincide with each other, and deciding a diameter of the single crystal from all images measured by use of the one-dimensional CCD camera over a measuring time which is longer than an oscillation cycle of the single crystal.

More particularly, for the measurement of the diameter of a single crystal, a growth portion of a single crystal 6, which is pulled up from a melt 3 of a crystalline starting material, is scanned on a plurality of scanning lines while moving the one-dimensional CCD camera 11 in parallel to the horizontal directions relative to the melt surface, and a diameter of the single crystal is obtained based on image signals from the one-dimensional CCD camera. The central position of a scanning line within a range of not smaller than a predetermined ratio (%) to the maximum value of the thus obtained diameter, is taken as a scanning position. Next, the growth portion is scanned, by means of the one-dimensional CCD camera 11, over a time longer than an oscillation cycle of the single crystal plural times at scanning intervals, each of which is shorter than the oscillation cycle of the single crystal. The diameters of the single crystal are calculated based on the image signals from the one-dimensional CCD camera, and a plurality of the diameters are selected from the resultant values in the order of decreasing value. In the method for measuring the diameter of a single crystal according to the invention, the average value of the selected diameters is determined as a diameter of the single crystal.

(2) An apparatus for measuring a diameter of a single crystal 6 to be grown from a melt 3 of a crystalline starting material according to the Czochralski method comprises a one-dimensional CCD camera 11 disposed at an outside of a chamber 7 to scan a growth portion of a single crystal via a window 8 provided at an upper portion of the chamber, an XY table 12 capable of moving the one-dimensional CCD camera in horizontal and vertical directions with respect to a melt surface, means for deciding a scanning position, at which an image of a growth portion of a single crystal is measured, from image signals of the one-dimensional CCD camera moved in parallel to the horizontal directions relative to the melt surface by means of the XY table, and means for determining a diameter of the single crystal based on image signals of the one-dimensional CCD camera, with which the single crystal is scanned at the scanning position plural times at Scanning intervals shorter than an oscillation cycle of the single crystal over a time longer than the oscillation cycle of the single crystal.

The term "diameter of single crystal" used under (1) and (2) above means a diameter of a single crystal growth portion as scanned with the one-dimensional CCD camera, irrespective of a necking portion, a shoulder portion and a body portion of the single crystal.

DESCRIPTION OF PREFERRED EMBODIMENTS

Figure 2:
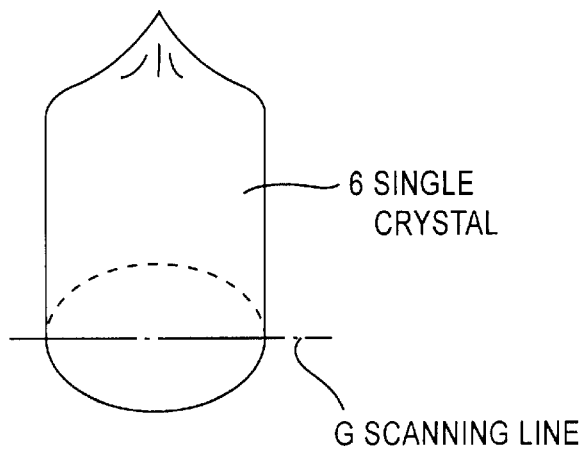
FIG. 2 is a view showing the relation between the scanning line of a camera and the single crystal growth portion in case where a one-dimensional CCD camera is used for the measurement of a diameter of a single crystal.
Figure 4:
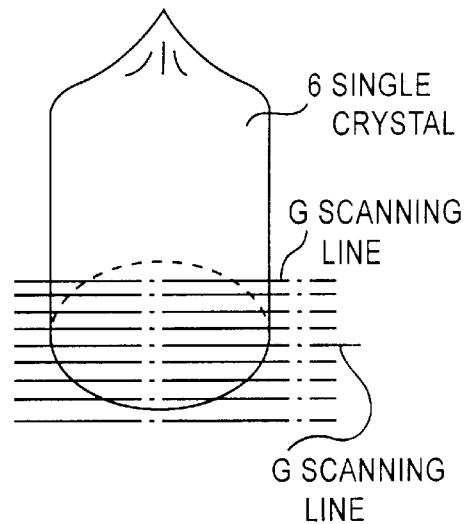
FIG. 4 is a view showing the relation between a plurality of scanning lines and the single crystal growth portion in case where a two-dimensional CCD camera is used for the measurement of a diameter of a single crystal.
Figure 3:
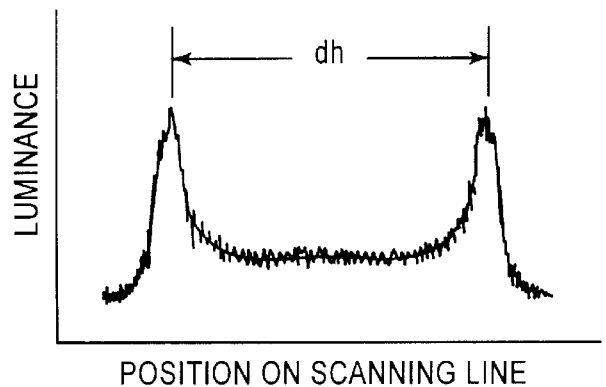
FIG. 3 is a view illustrating how to determine a diameter of a single crystal growth portion from a luminance distribution image on a scanning line, which is measured according to a one-dimensional CCD camera.

The oscillation of a single crystal being grown according to the Czochralski method depends on the conical pendulum movement of a pulling wire. Eventually, if the length of the pulling wire is determined, the oscillation cycle of the single crystal is also determined. Accordingly, when the scanning line of a one-dimensional CCD camera and the oscillation center of the single crystal are made coincident with each other, under which luminance distribution images are measured such that a number of measurements are repeated at scanning intervals shorter than the oscillation cycle and a time for the measurements (scanning intervals x the number of measurements) is longer than the oscillation cycle of the single crystal, an image, in which the aforementioned scanning line G, as is particularly shown in FIG. 2, runs across the center of the diameter of the single crystal, or an image close to the first-mentioned image, can be detected. Such an image appears at a constant probability during the oscillation cycle of the single crystal, so that the diameters of the single crystal are obtained from all the images measured during the oscillation cycle. An appropriate value of the diameter is selected from the thus obtained results, thus enabling one to accurately decide a diameter of the single crystal. The principle of this is illustrated with reference to FIGS. 5 and 6.

Figure 5:
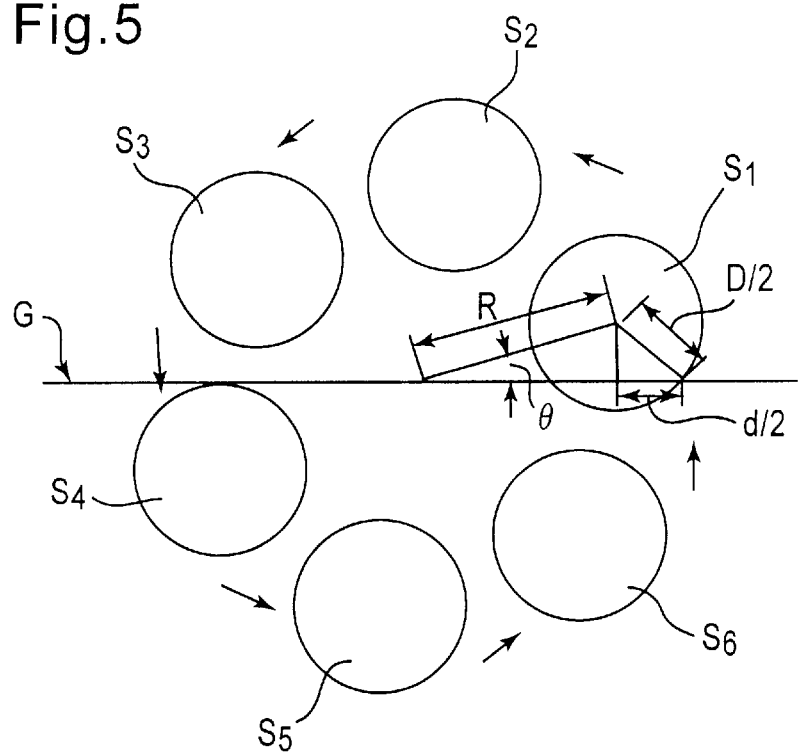
FIG. 5 is a view illustrating measurement of a diameter in case where the center of oscillation of a single crystal coincides with the scanning line of a one-dimensional CCD camera.

FIG. 5 shows the case where the oscillation center of a single crystal and the scanning line of a one-dimensional CCD camera are in coincidence with each other, and the single crystal oscillates according to the circular movement of $S_2 \to S_3 \to S_4 \to S_5 \to S_6$. In the figure, G is a scanning line, R is an oscillation radius, D is a diameter of a single crystal (an actual diameter), d is a diameter of the single crystal calculated from luminance distribution images, and θ is an angle made between the line connecting the center of the single crystal indicated by $S_1$ and the oscillation center and the scanning line.

The radius d/2 of the single crystal obtained from an image is defined according to the following equation $$d/2 = \sqrt{(D^2/4) - (R \sin \theta)^2}$$

Thus, $$d = 2\sqrt{(D^2/4) - (R \sin \theta)^2}$$

As stated hereinbefore, it is accepted that the limit of an error in the measurement of a diameter of single crystal is 10%. More particularly, the relation between the diameter, d, of the single crystal obtained from an image and the actual diameter, D, of the single crystal should satisfy $d \geq 0.9 \times D$.

This relation between the diameter, d, and the diameter, D, is influenced by the radius, R, and the angle, θ, of the oscillation. In the case where the radius, R, of the oscillation is changed (R=D−0.2D), a range of the angle, θ, which satisfies the relation of $d \geq 0.9 \times D$, and a probability, at which the range appears during the oscillation cycle, are geometrically calculated. The results are shown in Table 1.

TABLE 1

| Relation between oscillation radius, R, and diameter, D | Range of angle, θ (°), satisfying an error limit of 10% (d ≧ 0.9 × D) | Probability (%) |
| --- | --- | --- |
| R = D | 0 ≦ θ ≦ 12, 169 ≦ θ ≦ 192, 348 ≦ θ ≦ 360 | 13 |
| R = 0.8 × D | 0 ≦ θ ≦ 15, 165 ≦ θ ≦ 195, 345 ≦ θ ≦ 360 | 16 |
| R = 0.6 × D | 0 ≦ θ ≦ 21, 159 ≦ θ ≦ 201, 339 ≦ θ ≦ 360 | 23 |
| R = 0.5 × D | 0 ≦ θ ≦ 25, 155 ≦ θ ≦ 205, 335 ≦ θ ≦ 360 | 27 |
| R = 0.4 × D | 0 ≦ θ ≦ 33, 147 ≦ θ ≦ 213, 327 ≦ θ ≦ 360 | 36 |
| R = 0.2 × D | 0 ≦ θ ≦ 360 | 100 |

As will be apparent from Table 1, when the oscillation radius, R, of the single crystal is a half the diameter, D, of the single crystal (R=0.5×D), the diameter of the single crystal may be measured at a probability of 27% within a range of error of 10%. This means that when the diameter of the necking portion of the single crystal is taken as 5 mm and the oscillation radius is taken as 2.5 mm under which the diameter is measured 100 times during an oscillation cycle, 27 measurements are obtained within a range of error of 10% (0.5 mm).

The above information can be particularly applied to an apparatus of measuring a diameter of a single crystal in the following manner.

A one-dimensional CCD camera is arranged in such a way that a scanning line thereof is in coincidence with the center of oscillation of a single crystal. The growth portion of the single crystal is scanned plural times (e.g. N times) at scanning intervals, t, which are shorter than the oscillation cycle of the single crystal to measure luminance distribution images. At that time, the total measuring time (t×N) of the one-dimensional CCD camera should be greater than the oscillation cycle of the single crystal. The diameter of the single crystal is calculated from all of the measured images, and plural diameters (e.g. M: 2≦M<N) are selected in the order of decreasing value from the calculated ones. The average value of the plural diameters is determined as a diameter of the single crystal. In this way, even when the single crystal is oscillated, the diameter of the single crystal can be precisely determined. The selected M diameters should preferably be 2 or 3 in number while taking the noises occurring in the luminance distribution images into account.

Where the scanning line of the one-dimensional CCD camera is outside the oscillation center of the single crystal, it is necessary to cause the scanning line of the one-dimensional CCD camera to coincide with the oscillation center of the single crystal.

Figure 6:
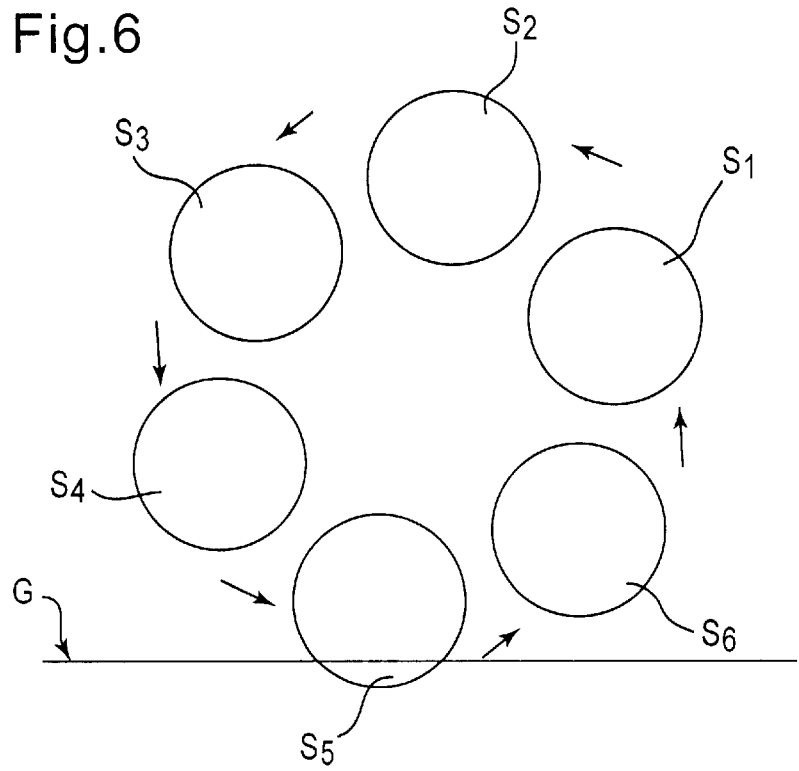
FIG. 6 is a view illustrating measurement of a diameter in case where the scanning line of a one-dimensional CCD camera does not coincide with the oscillation center of a single crystal.

FIG. 6 is a view illustrating the state of measuring the diameter in case where the scanning line of the one-dimensional CCD camera is not in coincidence with the oscillation center of a single crystal. In the figure, the scanning line is quite off from the oscillation center of the single crystal circularly moving along $S_1 \rightarrow S_2 \rightarrow S_3 \rightarrow S_4 \rightarrow S_5 \rightarrow S_6$, and crosses part of the single crystal at $S_5$. In this case, an accurate diameter cannot be measured. To avoid this, while the scanning line is moved in parallel to the horizontal directions relative to the melt surface, the luminance distribution images of a growth portion are measured, whereupon an average diameter of the single crystal calculated from the images measured with individual scanning lines changes. In this connection, however, since the single crystal is oscillated, the diameter of the single crystal calculated from the image measured with a given scanning line varies, and the diameter of the single crystal obtained in this manner is understood as an average diameter.

Figure 7:
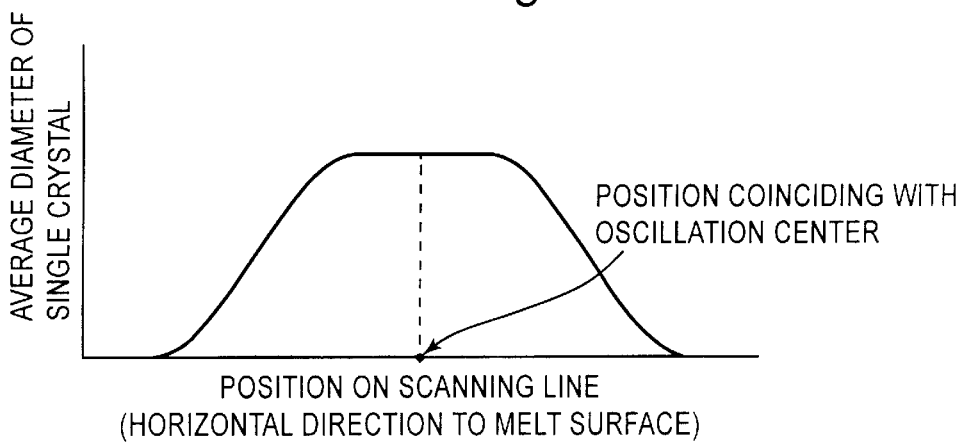
FIG. 7 is a graph showing a variation in average diameter of a single crystal in case where a scanning line is moved in parallel to horizontal directions relative to the surface of a melt.

FIG. 7 is a view showing a variation in average diameter of a single crystal in case where the scanning line is moved in parallel to the horizontal directions relative to the melt surface. As will be apparent from FIG. 7, as the scanning line comes closer to the oscillation center of the single crystal, an average diameter increases and arrives at a given level. After reaching a plateau level, the average diameter decreases as the scanning line is moved away from the oscillation center of the single crystal. Accordingly, the range where the average diameter of the single crystal is at a certain level is one where the scanning line and the oscillation center come close to each other. The position of the center within a range where the average diameter of the single crystal becomes constant is one where the scanning line and the oscillation center coincide with each other.

As described above, in order to permit the scanning line of the one-dimensional CCD camera and the oscillation center of the single crystal to coincide with each other, an image of a growth portion should be measured by scanning the single crystal on a plurality of scanning lines while moving in parallel to the horizontal directions relative to the melt surface. The average diameter of the single crystal is obtained based on an image signal from every scanning line of the one-dimensional CCD camera, thereby obtaining the relation between the position of the scanning line and the average diameter of the single crystal as shown in FIG. 7. The above-indicated range where the average diameter of the single crystal is at a certain level can be understood as a range of not smaller than a certain ratio to the maximum value of the average diameter of the single crystal (e.g. X%). More particularly, FIG. 8, referred to in more detail hereinafter, is a graph showing the relation between the position of the scanning line and the average diameter at the necking portion in case where the one-dimensional CCD camera is moved in parallel to the horizontal directions relative to the melt surface at intervals of 0.5 mm. In the figure, the maximum value of the average diameter is 5.1 mm, so that a range of not less than 90% of the maximum value of 5.1 mm (i.e. a range of average diameter value not smaller than 4.6 mm), is taken as a range where the average diameter of the single crystal becomes constant. Thereafter, the positions of the scanning line corresponding to that range are determined, and the central position is decided as a scanning position of the one-dimensional CCD camera, thereby permitting the scanning line to coincide with the oscillation center of the single crystal.

Figure 8:
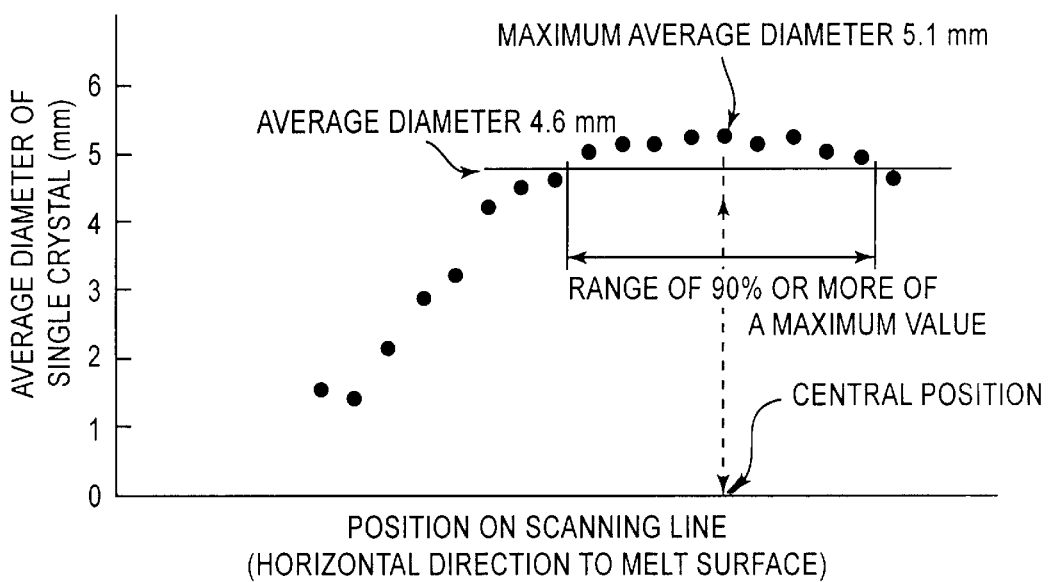
FIG. 8 is a graph showing the relation between the scanning line position and the average diameter of a necking portion in case where a one-dimensional CCD camera is moved in parallel to the horizontal directions relative to the melt surface at intervals of 0.5 mm.

X% defined herein should preferably be in the range of 90 to 98%. In practice, where the one-dimensional CCD camera is moved parallel to the horizontal directions relative to the surface of a melt to measure images of growth portions, luminance distribution images at a rear side of the single crystal cannot be measured. For example, as shown in FIG. 8 illustrated hereinafter, any data cannot be obtained when the scanning line passes by the center position and is over a certain range of position. In FIG. 8, some variation takes place in the proximity of the center position. In order to overcome these deficiencies, a range of X% should be appropriately selected.

In order to accurately measure the diameter of a single crystal in the course of the growth of the single crystal, it is necessary not only to cause the scanning line to coincide with the oscillation center of the single crystal by moving the one-dimensional CCD camera in the horizontal directions relative to the melt surface, but also to move the camera in the vertical directions relative to the melt surface. More particularly, this is because the surface level of the melt varies depending on the deformation of a quartz crucible caused by the melting of a polycrystalline starting material and also on the growth of a single crystal, so that the influences of these variations have to be eliminated. Accordingly, the apparatus for measuring the diameter of a single crystal should be provided with means for moving the one-dimensional CCD camera in horizontal and vertical directions relative to the melt surface during the course of the growth of the single crystal. To this end, it is favorable to use an XY table.

EXAMPLES

Figure 1:
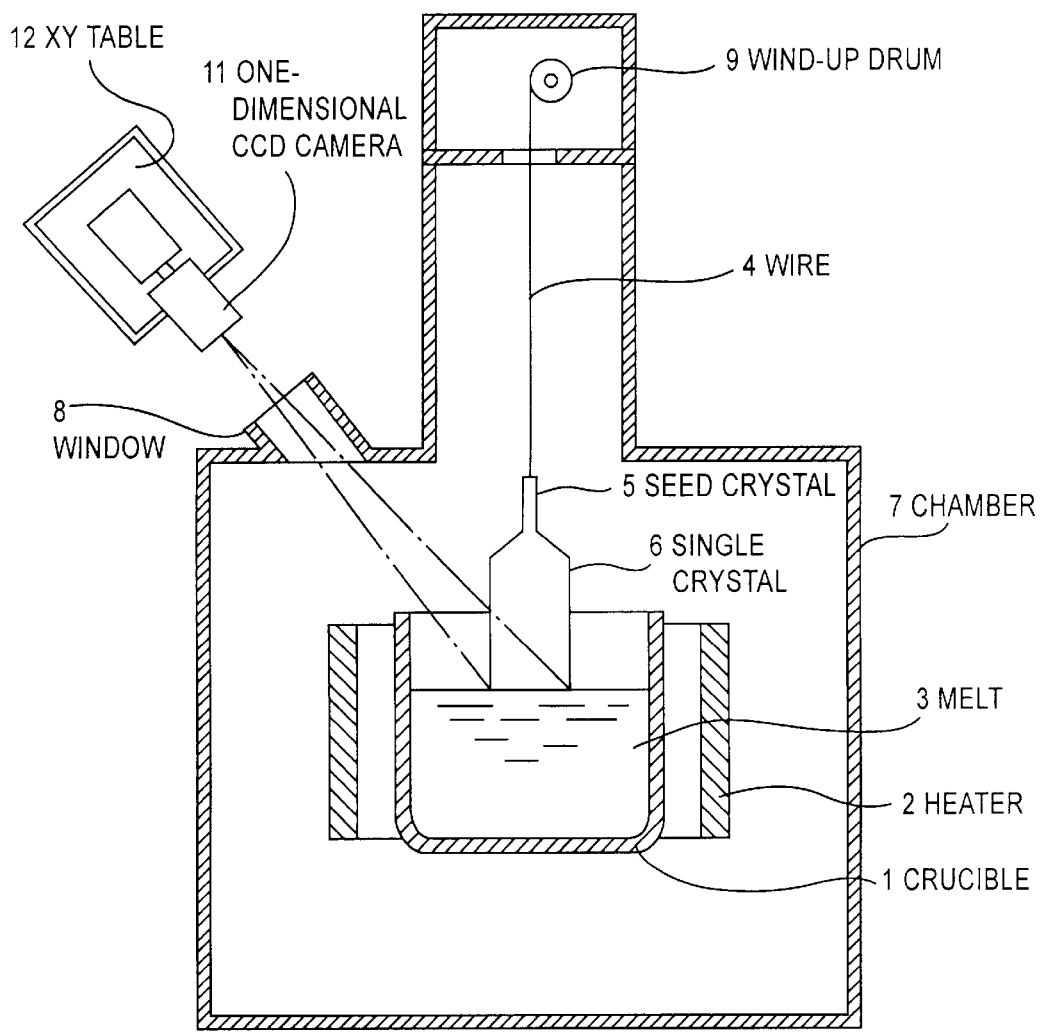
FIG. 1 is a schematic sectional view showing an apparatus for measuring a diameter of a single crystal according to the invention.

FIG. 1 is a schematic view showing an arrangement of an apparatus for measuring a diameter of a single crystal according to the invention. A one-dimensional CCD camera 11 is provided outside a chamber 7 to scan a growth portion of a single crystal 6 via a window 8 provided at the upper portion of the chamber. The camera 11 is able to move in the horizontal and vertical directions relative to the surface of a melt. 3 by means of an XY table 12. On the other hand, a wind-up drum 9 driven with a motor, not shown, is disposed at the upper portion of the chamber 7, and winds up a wire 4 and pulls up the single crystal 6.

The one-dimensional CCD camera used in the present invention may be one ordinarily used for this purpose, and has the number of elements at 2048 or 4096. The XY table has a stroke of about 100 mm in both X and Y directions and may have a minimal feed setting unit of approximately 0.01 mm.

Referring to FIG. 1, the control of a diameter at the necking portion is illustrated in case where a silicon single crystal having a diameter of 5 mm at the necking portion and a diameter of 200 mm at the body is grown.

As stated hereinbefore, the oscillation involved in the single crystal being pulled up is predominantly caused by the circular movement based on a conical pendulum. Assuming that the length of the, pulling wire extending from the wind-up drum to a seed crystal at the time of the growth of the necking portion is at 4 m, the oscillation cycle of the single crystal becomes four seconds. In order to cause the scanning line of the one-dimensional CCD camera to coincide with the oscillation center of the single crystal, the CCD camera was moved in parallel to the horizontal directions relative to the melt surface at intervals of 0.5 mm by means of the XY table to measure luminance distribution images, from which an average diameter at the necking portion was calculated.

FIG. 8 is a graph showing the relation between the position of the scanning line and the average diameter at the necking portion in case where the one-dimensional CCD camera is moved in parallel to the horizontal directions relative to the melt surface at intervals of 0.5 mm. As will be apparent from the figure, as the scanning line of the CCD camera comes closer to the oscillation center, the average diameter increases and has a maximum value as large as 5.1 mm. As is particularly shown in the figure, a range of 90%, or more of the maximum value (i.e. a range where the average value is 4.6 mm or over) was detected, and the central position within this range was determined. The one-dimensional CCD camera was moved to the central-position. In this way, the scanning line of the one-dimensional CCD camera can be agreed with the oscillation center of the single crystal.

In this connection, it has been confirmed that when the intervals of the parallel movement of the one-dimensional CCD camera are set at 0.2 mm and a range within 98% or over of a maximum value is detected, similar results are obtained.

Next, after the scanning line was caused to coincide with the oscillation center of the single crystal, the scanning intervals with the one-dimensional CCD camera was set at 200 milliseconds ($2 \times 10_{-1}$ seconds) to measure 25 images of the growth portion, thereby determining a diameter at the necking portion.

Figure 9:
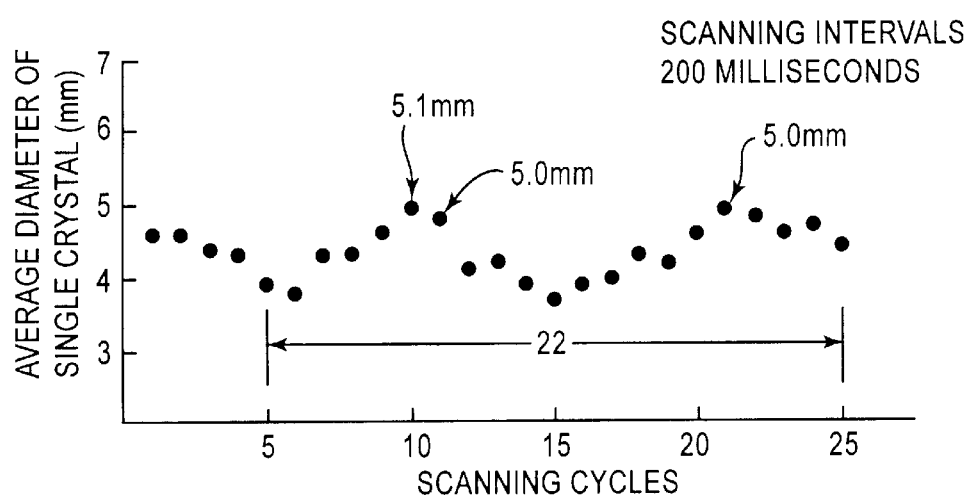
FIG. 9 is a graph showing the results of a diameter at a necking portion determined by 25 image measurements made by use of a one-dimensional CCD camera at scanning intervals of 200 milliseconds.

FIG. 9 shows the results of the diameter at the necking portion determined from the 25 image measurements at scanning intervals of 200 milliseconds by using the one-dimensional CCD camera. From the figure, it will be seen that the number of image measurements required for one oscillation cycle is at 22, from which the oscillation cycle of the single crystal is found to be 4.4 seconds (about 4 seconds). For the calculation of the diameter at the necking portion, diameters of the single crystal were calculated from all the images, and were placed in the order of decreasing value. Top three values (5.1 mm, 5.0 mm and 5.0 mm in FIG. 8) were selected, and an average value thereof at 5.03 was determined as a diameter of the single crystal.

In order to confirm the advantages of the invention, the diameters of a single crystal obtained according to the method of the invention were compared with the diameters found by use of a laser beam after growth of a single crystal.

Figure 10:
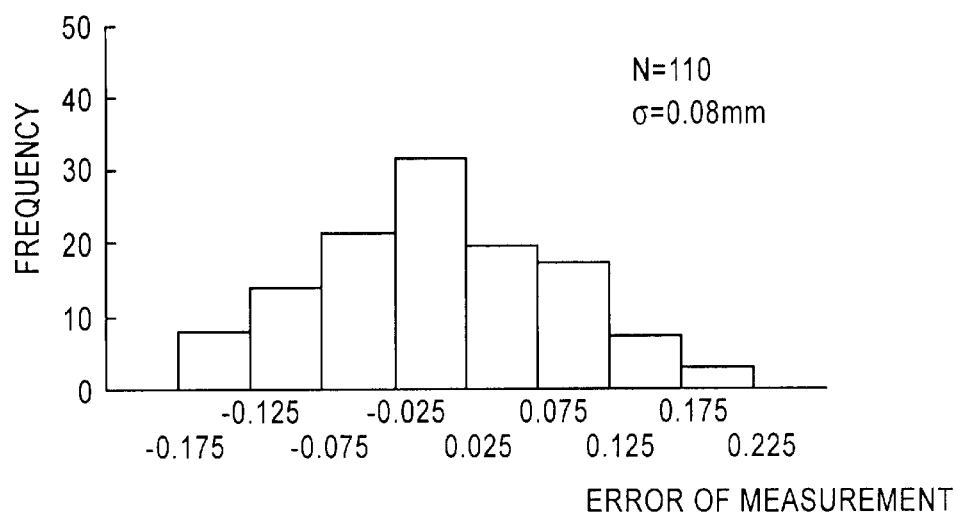
FIG. 10 is a histogram showing the results of comparison between the diameter of a necking portion obtained according to the method of the invention and the diameter of a necking portion found after growth of a single crystal.

FIG. 10 is a histogram showing the results of comparison between the diameters of the necking portion obtained according to the method of the invention and the diameters of the necking portion actually measured after growth of a single crystal. As will be apparent from the figure, the accuracy of the diameter of the single crystal obtained according to the method of the invention is so small in variation that σ=0.08 mm, unlike the found diameter. Thus, the method of the invention is an excellent measurement for the diameter of a single crystal. Thus, when the method of the invention is applied to such a measurement, the diameter of a single crystal at the necking portion can be precisely controlled, ensuring automatic necking operations without resorting to hands (or without resorting to manual operations). Thus, the growth operations can be performed in a more efficient manner.

Figure 11:
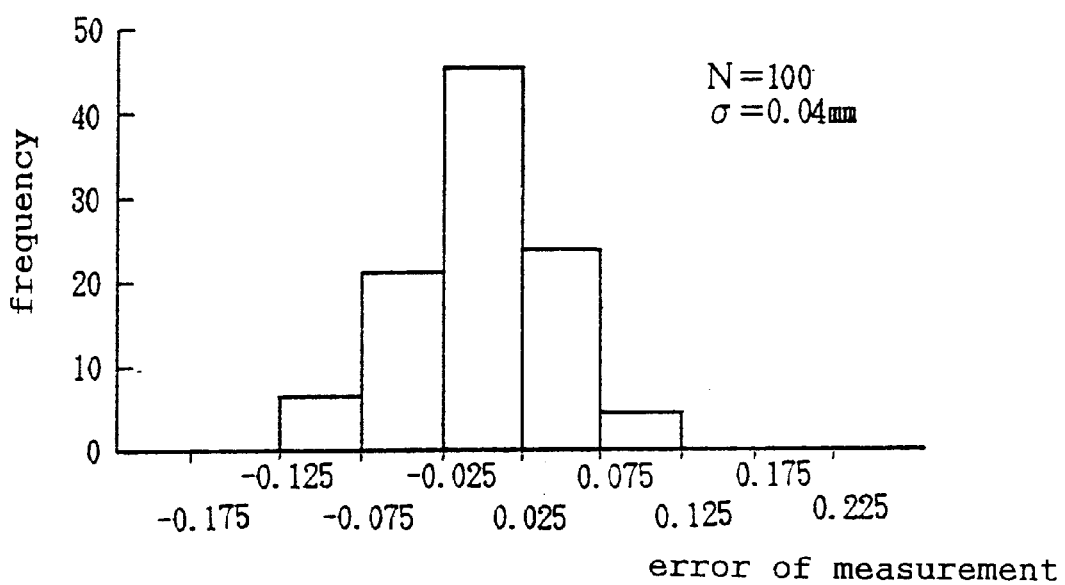
FIG. 11 is a histogram showing the results of comparison between the diameter of a body obtained according to the method of the invention and the diameter of a body found after growth of a single crystal.
Figure 12:
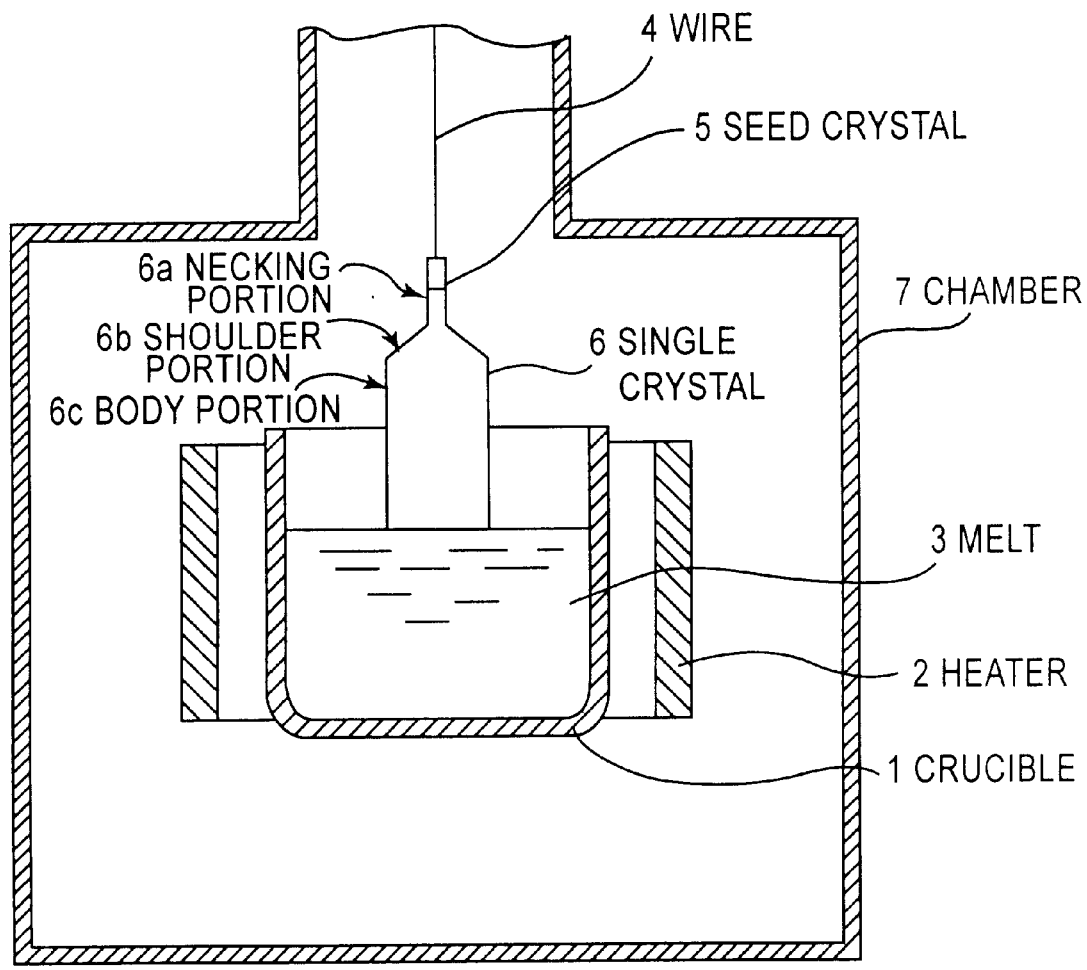
FIG. 12 is a schematic view showing a conventional silicon growing apparatus using the Czochralski method.

FIG. 11 is a histogram showing the results of comparison between the diameter of the body obtained according to the method of the invention and the diameter of the body actually measured after growth of a single crystal. The figure reveals that the diameter can be more precisely measured with respect to the body.

According to the method of the invention, not only the diameter of the necking portion, but also the diameters of the growth portions including the shoulder portion and the following can be precisely measured, ensuring the control of the diameter of a single crystal automatically without resorting to hands (or without resorting to manual operations). Further, using the apparatus of the invention, the demand for providing a large-sized and heavy weight single crystal can be met, and a single crystal can be grown efficiently.

What is claimed is:

1. A method for measuring a diameter of a single crystal comprising the steps of:

growing a single crystal according to the Czochralski method;

while growing said single crystal, causing an oscillation center of said single crystal and a scanning line of a one-dimensional CCD camera to coincide with each other while moving the one-dimensional CCD camera; and deciding a diameter of said single crystal from all images measured by means of a one-dimensional CCD camera over a measuring time which is longer than an oscillation cycle of said single crystal without moving the one-dimensional CCD camera.

2. A method according to claim 1, wherein the decided diameter of said single crystal is that of a necking portion, with an error of measurement being 10% or below.

3. A method according to claim 1, wherein the step of causing the oscillation center of said single crystal and the scanning line of the one-dimensional CCD camera to coincide with each other includes the steps of:

scanning a growth portion of the single crystal being pulled from a melt of a crystalline starting material on a plurality of scanning lines while moving the one-dimensional CCD camera in parallel to and in horizontal directions to a melt surface;

calculating diameters of the single crystal based on image signals from the one-dimensional CCD camera; and determining a central position of the scanning lines, which are within a range of a predetermined ratio (%) or over relative to a maximum value among the thus calculated diameters, as a scanning position.

4. A method according to claim 3, wherein the ratio to the maximum value among the diameters of the single crystal is in the range of 90 to 98%.

5. A method according to claim 1, wherein the step of deciding the diameter of the single crystal includes the steps of;

scanning a growth portion of the single crystal plural times at scanning intervals, which are each shorter than an oscillation cycle of the single crystal, by means of the one-dimensional CCD camera;

calculating diameters of the single crystal based on image signals from the one-dimensional CCD camera; and selecting a plurality of diameters in the order of decreasing value from the resultant diameters and calculating an average value of the selected diameters for use as a diameter of the single crystal.

6. A method according to claim 5, wherein 2 or 3 diameters are selected in the order of decreasing value.

* * * * *

UNITED STATES PATENT AND TRADEMARK OFFICE
CERTIFICATE OF CORRECTION

PATENT NO.    : 6,583,810 B1
DATED         : June 24, 2003
INVENTOR(S)   : Haruo Yamamura It is certified that error appears in the above-identified patent and that said Letters Patent is hereby corrected as shown below:

<u>Title page,</u>
Item [73], Assignee, change "Sumitomo Sitix Corporation, Amagasaki" to
-- Sumitomo Mitsubishi Silicon Corporation, Tokyo (JP) --

Signed and Sealed this

Fourteenth Day of October, 2003

JAMES E. ROGAN
*Director of the United States Patent and Trademark Office*